United States Patent
Mori

(10) Patent No.: US 7,683,388 B2
(45) Date of Patent: Mar. 23, 2010

(54) IMAGE PICKUP DEVICE WITH COLOR FILTER ARRANGED FOR EACH COLOR ON INTERLAYER LENSES

(75) Inventor: Shigeki Mori, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/359,598

(22) Filed: Feb. 23, 2006

(65) Prior Publication Data

US 2006/0197097 A1    Sep. 7, 2006

(30) Foreign Application Priority Data

Mar. 1, 2005    (JP) .............................. 2005-055774

(51) Int. Cl.
*H01L 33/00* (2006.01)

(52) U.S. Cl. .................. 257/89; 257/432; 257/233; 257/292; 257/184; 257/187; 257/259; 257/461; 257/431; 257/E27.082; 257/E27.15; 257/E29.227; 257/E29.24

(58) Field of Classification Search .................. 257/89, 257/95, 98, 440, 432, 184, 187, 259, 233, 257/292, 431, E27.082, E27.15, E29.065, 257/E29.277, E29.163, E29.24
See application file for complete search history.

(56) References Cited

U.S. PATENT DOCUMENTS

| | | | | |
|---|---|---|---|---|
| 5,739,548 | A * | 4/1998 | Shigeta et al. | 257/59 |
| 5,796,154 | A * | 8/1998 | Sano et al. | 257/432 |
| 6,221,687 | B1 | 4/2001 | Abramovich | 438/70 |
| 6,566,151 | B2 * | 5/2003 | Yeh et al. | 438/21 |
| 6,753,557 | B2 | 6/2004 | Nakai | |
| 6,903,395 | B2 | 6/2005 | Nakai et al. | |
| 7,019,373 | B2 | 3/2006 | Hashimoto | |
| 7,202,103 | B2 | 4/2007 | Sekine et al. | 438/70 |
| 7,358,475 | B2 * | 4/2008 | Tanaka et al. | 250/208.1 |
| 2004/0105022 | A1 | 6/2004 | Hirayama et al. | |
| 2004/0125190 | A1 * | 7/2004 | Koyama | 347/105 |
| 2004/0238908 | A1 * | 12/2004 | Hashimoto | 257/432 |
| 2005/0179103 | A1 * | 8/2005 | Nakai et al. | 257/436 |
| 2005/0200734 | A1 * | 9/2005 | Ahn et al. | 348/311 |
| 2006/0006485 | A1 * | 1/2006 | Mouli | 257/432 |

FOREIGN PATENT DOCUMENTS

| | | |
|---|---|---|
| JP | 4-37165 A | 2/1992 |
| JP | 6-85224 A | 3/1994 |
| JP | 9-116914 A | 5/1997 |

(Continued)

*Primary Examiner*—Wael Fahmy
*Assistant Examiner*—Marc Armand
(74) *Attorney, Agent, or Firm*—Fitzpatrick, Cella, Harper & Scinto

(57) ABSTRACT

An image pickup device is characterized by including a plurality of pixels having a plurality of photoelectric conversion units, convex interlayer lenses with respect to incident light, the convex interlayer lenses being arranged correspondingly to a photoelectric conversion devices and color filters being arranged for each color on the interlayer lenses correspondingly to the photoelectric conversion devices, wherein the color filter is formed to match the shape of the interlayer lens and the top surface thereof is substantially flat. This configuration reduces the amount of light which is incident on the gaps between adjacent microlenses and passes through the color filters at the boundary of pixels, decreasing color mixture of camera image.

10 Claims, 3 Drawing Sheets

FOREIGN PATENT DOCUMENTS

| | | |
|---|---|---|
| JP | 9-148549 | 6/1997 |
| JP | H11-040787 | 2/1999 |
| JP | 2000-164837 A | 6/2000 |
| JP | 2000-269474 A | 9/2000 |
| JP | 2003-224251 A | 8/2003 |
| JP | 2003-229553 A | 8/2003 |
| JP | 2003-332548 A | 11/2003 |
| JP | 2004-111867 A | 4/2004 |
| JP | 2005-12189 A | 1/2005 |
| JP | 2005-33074 A | 2/2005 |

* cited by examiner

IMAGE PICKUP DEVICE WITH COLOR FILTER ARRANGED FOR EACH COLOR ON INTERLAYER LENSES

BACKGROUND OF THE INVENTION

1. Field of the Invention

The present invention relates to an image pickup device and a camera equipped with a color filter for imaging color picture.

2. Related Background Art

A color image pickup device used in a color video camera, a color still camera and the like is disclosed in, for example, Japanese Patent Application Laid-Open No. H09-148549. A red, green and blue three-primary-color filters, a cyan and magenta complementary filters or others are formed on photoelectric conversion elements serving as photoelectric conversion units. Light passing through color filters is caused to be incident on the photoelectric conversion elements and is separated into an image signal of each color. A color signal can be obtained by synthesizing an image signal separated into each color. Such color filters formed on the photoelectric conversion elements are designated as "on-chip color filter".

A general example of an image pickup device with a conventional on-chip color filter is described in detail with reference to the drawings.

FIG. 1 is a general cross section showing the structure of an image pickup device with an on-chip color filter. A photoelectric conversion unit 110 for generating signal charges according to the amount of incident light is formed on a semiconductor substrate 100. The photoelectric conversion units 110 are arranged in a lattice shape and provided for each of pixels.

A driving circuit (not shown) for creating a pixel signal corresponding to a signal charge generated by the photoelectric conversion unit 110 and transferring it to a horizontal scanning circuit in response to a controlling signal from a vertical scanning circuit provided around the photoelectric conversion unit 110 is provided on each pixel.

A gate electrode 109 of a transistor constituting the above-mentioned driving circuit is formed on the silicon semiconductor substrate 100. A plurality of layers of wirings is formed thereon depending on a circuit configuration of the driving circuit. Incidentally, FIG. 1 shows an example of a configuration in which double layers of wirings are formed. An impurity diffusion region serving as a source and a drain of a transistor is formed on the semiconductor substrate 100.

Wirings 105 and 107 are patterned in a desired shape using aluminum and the like, and formed. The interlayer insulation films 106 and 108 consisting of, for example, $SiO_2$ and the like insulate between the wirings 105 and 107 and between the gate electrodes. The topmost wiring layer 105 is insulated with a passivation film (not shown) made of, for example, SiN.

A first planarized film 104 made of, for example, acrylic resin is formed immediately on the passivation film. Color filters 103 corresponding to the pixels are provided on the first planarized film 104. Color filters 103 are formed by using, for example, photoresist containing pigments of the three primary colors: red, green and blue. The color filter is covered with any one of red, green or blue pigment for each pixel.

A second planarized film 102 with optical transparency is formed on the color filter 103. A microlens 101 for effectively converging incident light on the photoelectric conversion unit 110 is formed on the second planarized film 102. The microlens 101 is sometimes not disposed.

FIGS. 2A, 2B and 2C are cross sections showing a sequence for forming the conventional color filter described in FIG. 1.

When the color filter shown in FIG. 1 is formed, to begin with, the first planarized film 104 is formed on the surface of the passivation film (not shown). Thereafter, a negative color resist in which, for example, a green pigment is scattered is coated on the surface of the first planarized film 104. Subsequently, an ultraviolet ray of a wavelength of, for example, 365 nm is irradiated on a position where a green color filter is formed (hereinafter referred to as "filter G") using a mask to develop a color resist. Thereby a filter G 103G is formed on the first planarized film 104 as shown in FIG. 2A.

In the next place, as shown in FIG. 2B, a negative color resist 103A in which, for example, a red pigment is scattered is coated on the entire surface of the first planarized film 104 so as to cover the filter G 103G. Subsequently, an ultraviolet ray of a wavelength of, for example, 365 nm is irradiated on a position where a red color filter is formed (hereinafter referred to as "filter R") using a mask to develop a color resist, thereby forming a filter R 103R as shown in FIG. 2C.

Furthermore, a negative color resist in which, for example, a blue pigment is scattered (not shown) is coated on the entire surface of the first planarized film to cover the filters G and R. Thereafter, an ultraviolet ray is irradiated as is the case with the filters G and R to develop a color resist, thereby forming a blue color filter (hereinafter referred to as "filter B").

As shown in FIGS. 2A, 2B and 2C, the second and following color filters to be formed are slightly elevated at the end portion of the pixels by the color filter previously formed. The color filter which is thus formed is formed substantially evenly in thickness inside the pixel.

FIGS. 3A and 3B are cross sections showing a sequence for forming a microlens illustrated in FIG. 1. When the microlens shown in FIG. 1 is formed, firstly, for example, a positive transparent resist is coated on the surface of the second planarized film 102. Secondary, an ultraviolet ray of a wavelength of, for example, 365 nm is irradiated to develop the transparent resist using a mask on which light shielding portions are formed except for the boundaries between the pixels. Thus, a rectangular-parallelepiped structure 101A is formed as shown in FIG. 3A. Thereafter, the rectangular-parallelepiped structure 101A is thermally fused to form a microlens 101 as shown in FIG. 3B.

A configuration on a color filter is disclosed in Japanese Patent Application Laid-Open No. 2000-012814, in which microlenses in a color image pickup device equipped with microlenses are formed to be equal in curvature and thickness for each pixel, and the three-primary-color thin filters are provided on the surface thereof, thereby enabling providing a high color reproduction.

On the other hand, Japanese Patent Application Laid-Open No. 2004-281911 has disclosed a configuration on an on-chip color filter formed to be embedded between wiring layers in an image pickup device with multi-layered wirings. Such a configuration suppresses eclipse of an oblique incident light caused by a wiring layer to improve sensitivity shading, dependence of sensitivity on F-number and color mixture. FIG. 4 shows a regular octagon microlens as one example of a microlens. A gap between adjacent microlenses is designated as a "microlens gap 101B". It is desired that the microlens gap 101B is formed as narrowly as possible to improve sensitivity in a sensor and to suppress a color mixture.

The microlens gap 101B, however, is larger in the direction of 45 degrees than in the parallel direction with respect to a pixel arrangement direction. Even though the microlens gap in the parallel direction with respect to the pixel arrangement direction is reduced close to zero, it is technically difficult to reduce the microlens gap in the direction of 45 degrees with respect to the pixel arrangement direction.

The following is a description of color mixture.

Light beams "a" and "b" are incident on an image pickup device, for instance, through optical paths shown in FIG. 5. The light beam "a" passed through a microlens 101, a second planarized film 102, color filter 103, a first planarized film 104. Further it is transmitted through a plurality of interlayer insulation films 106 and 108 and reaches the photoelectric conversion unit 110.

The light beam "b," on the other hand, is incident on the boundary between the pixels, that is, the gap between the adjacent microlenses. The light beam repeats reflections, scattering, refraction, and diffraction at the boundary between the adjacent color filters and in the wiring layers 107 and 105, straying, and in part reaching the photoelectric conversion unit. Even in a case where the microlenses are not provided, light beams incident on the boundaries between the pixels stray similarly.

Stray light components sometimes cause a problem with color mixture because of their reaching the photoelectric conversion units of pixels which stray light components should not reach. The major part of the stray light components are transmitted through the boundaries between the color filters of the adjacent pixels, and reflected by the wiring layers. These components will be transmitted through any of the color filters if there are no boundaries between adjacent color filters. When the incident light is white light, its components reflected by the wiring layers are attenuated to at least about one third by transmitting them through the color filters. Therefore, in order to reduce the stay light components it is important to transmit light beams through the color filters with the gaps lessened between adjacent color filters.

For example, when light beams from a red subject are incident on a blue pixel, most of light beams incident on the microlens are absorbed by the filter B. However, stray light components incident on gaps between adjacent microlenses are incident both on the filter B and on the filter G formed next to the former. These components incident on the filter G are incompletely absorbed, and partly transmitted. Thereafter, the components repeat reflections, scattering, refraction, and diffraction and partly reaching the photoelectric conversion unit of a blue pixel. Color mixture is thus caused by information from a red subject reaching the photoelectric conversion unit of a blue pixel which it should not reach. As described above, to decrease a color mixture it is important to reduce the amount of light transmitted through color filters at the boundaries between pixels.

In the configuration described in the aforementioned patent publication, however, the amount of light transmitted through color filters at the boundaries between pixels is not decreased, so that color mixture is liable to be caused by light beams being transmitted through gaps between microlenses or through adjacent incorrect color filters and being incident on the photoelectric conversion unit.

SUMMARY OF THE INVENTION

An image pickup device is characterized by including a plurality of photoelectric conversion units, interlayer lenses convexed lenses arranged correspondingly to the photoelectric conversion units, and color filters arranged for each color on the interlayer lenses correspondingly to the photoelectric conversion units, wherein the color filter is formed to match the shape of the interlayer lens and the top surface thereof is substantially planarized.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

First Embodiment

Figure 1:
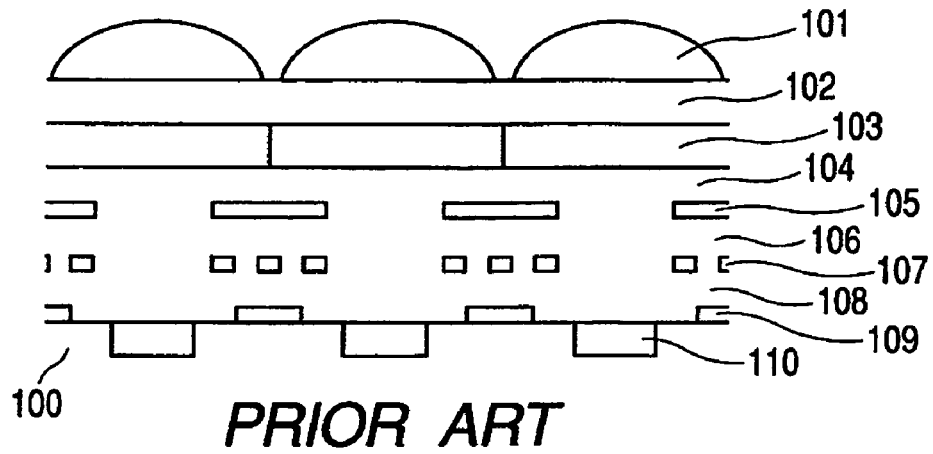
FIG. 1 is a cross section showing the structure of a conventional image pickup device.
Figure 2A:
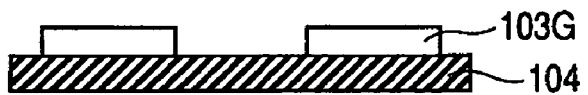
FIGS. 2A, 2B and 2C are cross sections showing a sequence for forming a conventional color filter.
Figure 2B:
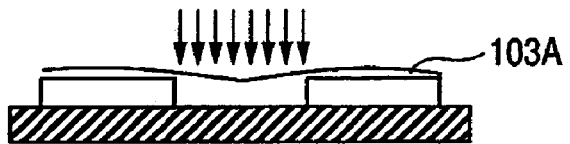
Figure 2C:
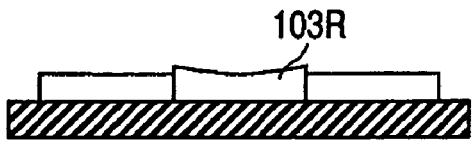
Figure 3A:
FIGS. 3A and 3B are cross sections showing a sequence for forming a microlens.
Figure 3B:
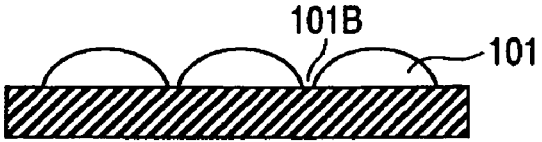
Figure 4:
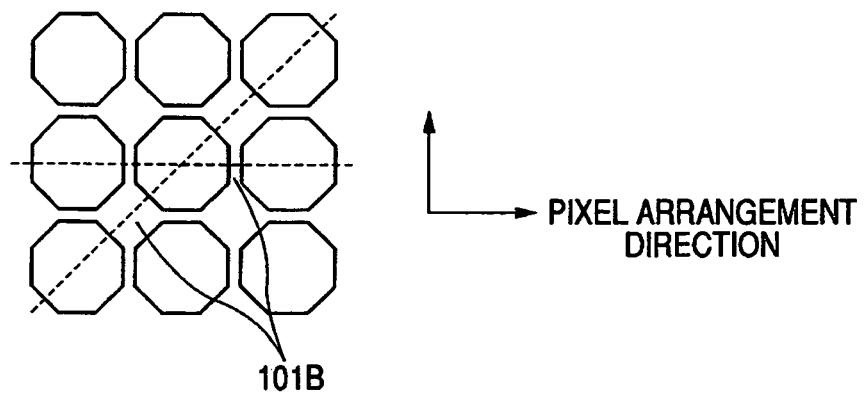
FIG. 4 is a top view showing an example of shape of a microlens.
Figure 5:
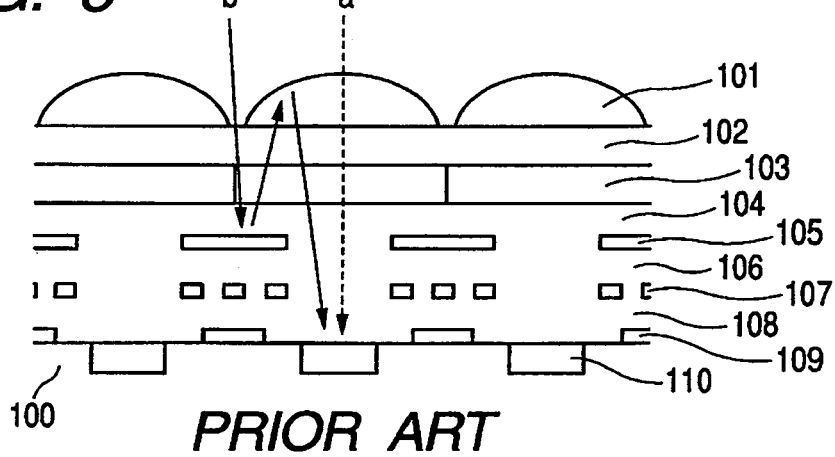
FIG. 5 is a cross section of an example of optical paths of incident light traveling from a subject to the image pickup device.
Figure 6:
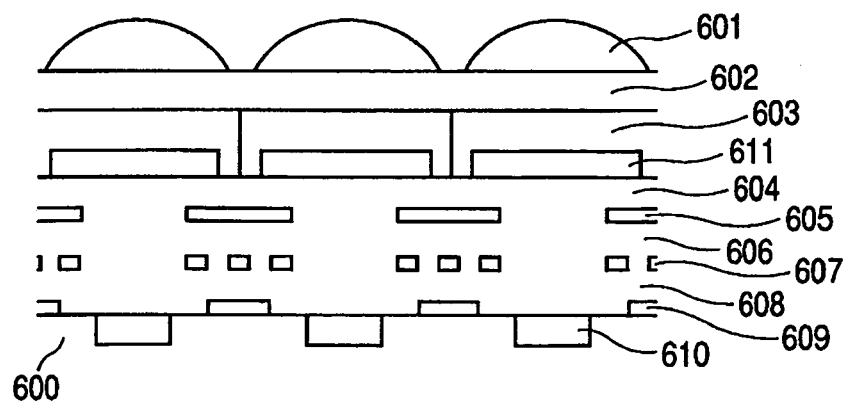
FIG. 6 is a cross section showing the structure of an image pickup device according to a first embodiment.

FIG. 6 is a cross section showing the structure of an image pickup device according to a first embodiment. An n-type semiconductor region serving as a photoelectric conversion unit 610 is formed in a p-type semiconductor region 600. A gate electrode 609 of a MOS transistor for configuring pixels is formed, and then a first interlayer insulation film 608 is formed to separate the gate electrode 609 from a first wiring 607.

In addition, a second interlayer insulation film 606 is formed to separate the first wiring 607 from a second wiring 605. A first planarized film 604 is formed on the first wiring 605. Furthermore, three kinds of color filters 603 (distinctions among R, G, and B being not shown) for transmitting red (R), green (G) and blue (B) lights are formed on the planarized film 604 opposing the photoelectric conversion unit 610. Methods of arranging a three primary color filter consisting of R, G and B include Bayer array, interline array, and stripe array. In addition to the above, methods of arranging a complementary filter include a color difference sequential arrangement and the like. The present embodiment is independently of a color filter arrangement, but it is preferable to use Bayer array if a three primary color filter is used. It is also preferable that wirings are arranged only between the color filter and the photoelectric conversion unit.

A "transparent structure under color filter" 611 which is transparent to incident light (hereinafter referred to as "transparent structure") is formed on the surface of the color filter 603 opposing the photoelectric conversion unit 610. The transparent structure 611 serves to form the color filter 603 thicker at the periphery than at the center thereof. A transparent material being equal in refractive index to the color filter 603 is preferable as a material for use in the transparent structure 611, whereby light will not be reflected.

A second planarized film 602 and microlens 601 are formed on the color filter 603. The microlens 601 may not always be formed directly on the color filter 603. However, it is preferable that the microlens 601 is directly formed on the color filter because a space between the color filter 603 and the microlens 601 tends to generate stray light.

The color filter 603 around the pixels is twice as thick as the transparent structure 611.

It is preferable that the transparent structure 611 absorbs little light and has the same refractive index as the color filter 603. The transparent structure 611 uses an acrylic negative resist as being a principal component (before pigment is contained) of the resist used in forming the color filter 603.

As a material for the color filter 603, is used a material superior in a flattening characteristic, that is, it is irregularity-resistant in filling gaps between the transparent structures 611 of adjacent pixels. It is preferable not to make gaps between the color filters 603. It is further preferable that the transparent structure 611 is arranged at the same position relatively to the microlens 101. It is also preferable that the microlens 601 is similar in shape to the transparent structure 611. This enables reducing the amount of stray light because light transmitted through interstices between adjacent microlenses passes through thicker portions of the color filters.

When the microlens 611 is formed, for example, in the regular octagon, viewed from the top, it is also preferable that the transparent structure 611 is formed similarly to the regular octagon, viewed from the top.

In the image pickup device according to the present embodiment, the portion of the color filter corresponding to space between adjacent microlenses is thickened, specifically, twice as thick as the other portion in the filter. This allows substantially reducing stray-light components which are incident on the portion corresponding to the space between adjacent microlenses and pass through the portion, thereby decreasing color mixture. The thickness is not limited to this value, if the color filter is made thicker at the end portion of pixels than at the center thereof, effect of the present embodiment can be obtained.

Second Embodiment

Figure 7:
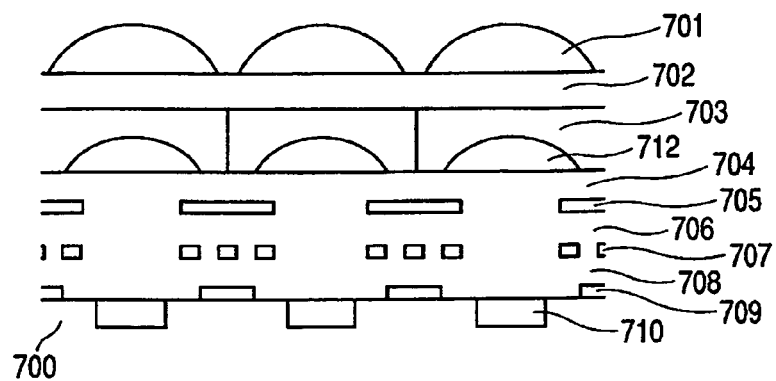
FIG. 7 is a side cross-section showing the structure of an image pickup device according to a second embodiment.

FIG. 7 is a cross section showing the structure of an image pickup device according to a second embodiment.

An n-type semiconductor region serving as a photoelectric conversion unit 710 is formed in a p-type semiconductor region 700. A gate electrode 709 of a MOS transistor for configuring pixels is formed, and then a first interlayer insulation film 708 is formed to separate the gate electrode 709 from a first wiring 707.

In addition, a second interlayer insulation film 706 is formed to separate the first wiring 707 from a second wiring 705. A first planarized film 704 is formed on the first wiring 705. Furthermore, three kinds of color filters 703 (distinctions among R, G, and B being not shown) for transmitting red (R), green (G) and blue (B) lights are formed on the planarized film 704 opposing the photoelectric conversion unit 710.

For the color filter arrangement, various kinds of arrangements are available as described in the first embodiment, it is preferable to use Bayer array in the second embodiment when the three primary color filter is used as is the case with the first embodiment. The present embodiment is different from the first embodiment in that the transparent structure under color filter 611 in the first embodiment is formed in a lens shape to form an interlayer lens 712, on which a color filter 703 is formed.

The interlayer lens 712 in the present embodiment is made of SiN. The material for the interlayer lens 712 is not limited to SiN. A material which has a larger refractive index than the color filter is preferable because such a material contributes to improvement in characteristics as a lens. It is preferable that the interlayer lens 712 is smaller in dimension than the color filter 703 and equal to or a little larger than the surface of the photoelectric conversion unit 710. The interlayer lens 712 is approximately equal in thickness to the central portion of the color filter where the filter is the thinnest. The color filters are so formed as to bridge the spaces between the interlayer lenses 712 of adjacent pixels, that is to say, the boundaries of pixels therebetween. Thus, the color filters at the boundaries of pixels are approximately twice as thick as those at the center of the pixels.

It is advisable to determine the dimensions of the interlayer lenses so that incident light can be effectively led from the microlens into the photoelectric conversion unit. For instance, it is advisable to determine the dimensions in consideration of a numerical aperture of a camera lens and a distance from the microlens to the photoelectric conversion unit 710.

A material used for the color filter 703 is superior in a flattened characteristic, that is, being wrinkle-resistant in bridging the abovementioned boundary of the pixels. The top surface of the color filter 703 is formed substantially flat.

When the microlens 701 is formed on the top portion of the color filter, the color filter 703 is required to be flatter, so that it is allowable to provide a process for flattening the top surface of the color filter 703. The planarized film can be made thinner through the flattening process than without the flattening process.

It is allowable to provide a film for reducing reflections by the interface between the interlayer lens 712 and the color filter 703. This is especially suitable for the case where the interlayer lens 712 is made of SiN and its refractive index is on the order of 2.0. This is because a difference in refractive index between the color filter and the interlayer lens is increased due to a refractive index of an organic material forming the color tilter being in general about 1.5.

In the image pickup device according to the present embodiment, the color filters at the boundary of the pixels are about twice as thick as the center of the pixels which is the thinnest. This enables substantially reducing stray-light components which are incident on the gaps between adjacent microlenses and pass through the color filters of adjacent photoelectric conversion elements, and decreasing color mixture of camera image. Needless to say, even if the microlens is not provided, it is also possible to substantially reduce stray-light components caused by light which is incident on the boundary of the pixels.

Provision of an interlayer lens further improves a converging efficiency. Forming the color filters immediately on the interlayer lens enables shortening the distance between the photoelectric conversion unit and the microlens. That is to say, the foregoing stray-light components can be substantially decreased without degradation in sensitivity attributed by an oblique incident light. It is advisable to apply this configuration to structure with a plurality of wiring layers.

In a typical process, an interlayer lens is formed first, thereafter a planarized film is formed for a microlens and others, but this process can be skipped by flattening the top surface of the color filter.

The relation in thickness between the color filter and the interlayer lens is not limited to this value. If the color filter inside the pixel is formed thicker at the end portion of the pixel than at the center portion thereof, the effect of the present embodiment can be obtained.

(Application to Image Pickup System)

Figure 8:
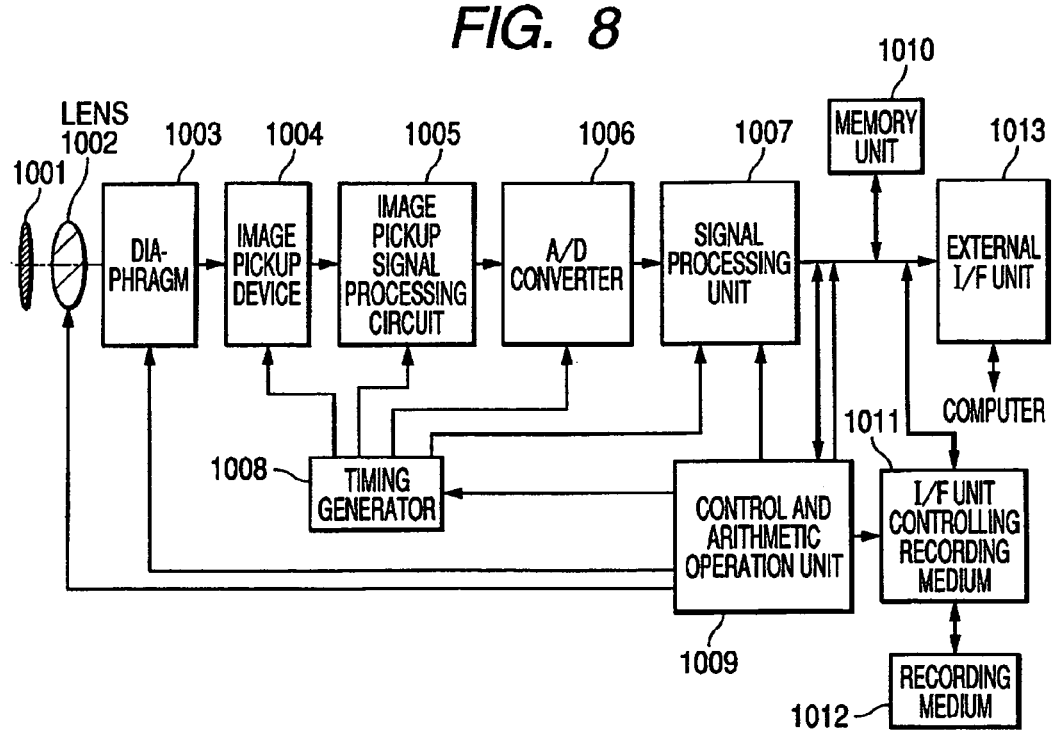
FIG. 8 is a circuit block diagram of a digital camera.

For example, the image pickup device can be applied to an image pickup system such as a digital still camera and a digital video camera. In the present embodiment, its application to a digital still camera is exemplified. FIG. 8 shows one example of a circuit block diagram of a digital still camera. A shutter 1001 is positioned in front of an imaging lens 1002 and controls exposure. A diaphragm 1003 controls the amount of light according to need, and causes an image pickup device 1004 to image. A signal outputted from the image pickup device 1004 is processed by a signal processing circuit 1005 and is converted from an analog signal to a digital signal by A/D converter 1006. The outputted digital signal is arithmetically processed by a signal processing unit 1007. The processed digital signal is sent to an external equipment through a memory 1010, or an external I/F unit 1013. The image pickup device 1004, image pickup signal processing circuit 1005, A/D converter 1006 and signal processing unit 1007 are controlled by a timing generator 1008. The system as a whole is controlled by a control and arithmetic operation unit 1009. These controlling units and image pickup device are separately depicted in the block diagram, but may be integrated into one chip. The output digital signals are recorded via an I/F controlling processing medium 1011 controlled by the control and arithmetic operation unit to record picture images in a recording medium 1012.

Any of the above embodiments is cited merely by way of example to embody the present invention and is not to be construed to limit the technical scope of the present invention. That is, it is obvious that the present invention can be implemented in various forms without departing from its technical idea or its primary characteristics.

This application claims priority from Japanese Patent Application No. 2005-055774 filed on Mar. 1, 2005, which is hereby incorporated by reference herein.

What is claimed is:

1. An image pickup device, comprising:
    a plurality of photoelectric conversion units arranged two-dimensionally;
    a plurality of interlayer lenses, each having a shape convexed toward incident light directly above a respective one of the plurality of photoelectric conversion units, wherein a surface opposite to the convexed shape and facing the respective photoelectric conversion unit is flat;
    a plurality of color filters, each arranged on a respective one of the plurality of interlayer lenses and each filtering a color different from a color filtered by an adjacent color filter, wherein interfaces are formed between the adjacent color filters of different colors;
    a planarized film arranged on the plurality of color filters; and
    a plurality of microlenses arranged on the planarized film, each having a shape convexed toward incident light and aligned above a respective one of the plurality of the interlayer lenses,
    wherein each of the plurality of color filters has a bottom surface that matches the convexed shape of a corresponding one of the plurality of interlayer lenses, and a top surface that is substantially planarized,
    wherein regions between adjacent microlenses are positioned above the interfaces between the color filters,
    wherein a thickness of each of the plurality of color filters increases from a central portion thereof toward boundary portions with adjacent color filters, so that light incident from the regions between the microlenses decreases at the boundary portions including the interfaces between the color filters, and
    wherein a thickness at the boundary portions of the color filters is twice as thick as a thickness at the central portions of the color filters.

2. The image pickup device according to claim 1, wherein the plurality of microlenses respectively corresponds with the plurality photoelectric conversion units.

3. The image pickup device according to claim 1, further comprising an antireflection film arranged between the plurality of interlayer lenses and the plurality of color filters.

4. The image pickup device according to claim 1, wherein the image pickup device is part of an image pickup system that includes:
    an optical system for imaging light on the image pickup device; and
    a signal processing circuit for processing an output signal from the image pickup device.

5. The image pickup device according to claim 1, wherein each microlens and each interlayer lens are shaped into an octagon.

6. An image pickup device, comprising:
    a plurality of photoelectric conversion units arranged two-dimensionally;
    a plurality of interlayer lenses, each having a convexed surface directly above a respective one of the plurality of photoelectric conversion units and a substantially flat surface opposite to the convexed surface, with the flat surface facing the respective photoelectric conversion unit;
    a plurality of color filters each arranged on a respective one of the plurality of interlayer lenses and each filtering a color different from a color filtered by an adjacent color filter, wherein interfaces are formed between the adjacent color filters of different colors;
    a planarized film arranged on the plurality of color filters; and
    a plurality of microlenses arranged on the planarized film, each having a shape convexed toward incident light and aligned above a respective one of the plurality of the interlayer lenses,
    wherein each color filter has a first surface that matches the convexed surface of a corresponding interlayer lens, and a substantially flat second surface opposite to the first surface extending along the convexed surface of the interlayer lens,
    wherein regions between adjacent microlenses are positioned above the interfaces between the color filters,
    wherein a thickness of each of the plurality of color filters increases from a central portion thereof toward boundary portions with adjacent color filters, so that light incident from the regions between the microlenses decreases at the boundary portions including the interfaces between the color filters, and
    wherein a thickness at the boundary portions of the color filters is twice as thick as a thickness at the central portions of the color filters.

7. The image pickup device according to claim 6, wherein the plurality of microlenses respectively corresponds with the plurality of photoelectric conversion units.

8. The image pickup device according to claim 6, further comprising an antireflection film for reducing reflections at an interface between the plurality of interlayer lenses and the plurality of color filters.

9. The image pickup device according to claim 6, wherein the image pickup device is a part of an image pickup system that includes:
   an optical system for imaging light on the image pickup device; and
   a signal processing circuit for processing an output signal from the image pickup device.

10. The image pickup device according to claim 6, wherein each microlens and each interlayer lens are shaped into an octagon.

* * * * *